(12) United States Patent
Furubayashi et al.

(10) Patent No.: US 9,910,363 B2
(45) Date of Patent: Mar. 6, 2018

(54) MEASUREMENT APPARATUS, EXPOSURE APPARATUS, MEASUREMENT METHOD, AND RECORDING MEDIUM

(71) Applicant: Toshiba Memory Corporation, Tokyo (JP)

(72) Inventors: Ai Furubayashi, Yokohama (JP); Takaki Hashimoto, Yokohama (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 129 days.

(21) Appl. No.: 15/065,020

(22) Filed: Mar. 9, 2016

(65) Prior Publication Data

US 2017/0068170 A1 Mar. 9, 2017

Related U.S. Application Data

(60) Provisional application No. 62/216,071, filed on Sep. 9, 2015.

(51) Int. Cl.
*G01B 11/02* (2006.01)
*G03F 7/20* (2006.01)
*G01B 11/27* (2006.01)

(52) U.S. Cl.
CPC ........ *G03F 7/70141* (2013.01); *G01B 11/272* (2013.01)

(58) Field of Classification Search
CPC ............. G03F 7/70141; G03F 7/70775; G03F 9/7003; G03F 9/7019; G03F 9/7023;
(Continued)

(56) References Cited

U.S. PATENT DOCUMENTS

| 5,525,808 A * | 6/1996 | Irie ........................ G03F 9/7003 250/548 |
| 2008/0013090 A1 * | 1/2008 | Hagiwara ............. G03F 9/7026 356/400 |

(Continued)

FOREIGN PATENT DOCUMENTS

| JP | 3-223610 | 10/1991 |
| JP | 8-288211 | 11/1996 |

(Continued)

*Primary Examiner* — Tarifur Chowdhury
*Assistant Examiner* — Jonathon Cook
(74) *Attorney, Agent, or Firm* — Oblon, McClelland, Maier & Neustadt, L.L.P.

(57) ABSTRACT

According to one embodiment, in a measurement apparatus, a controller acquires a first signal waveform, a second signal waveform, and a third signal waveform. Among $m^{th}$ diffraction light and $\pm n^{th}$ diffraction light, the first signal waveform is related to spatial distribution of light intensity about first interference light by interference of the $\pm n^{th}$ diffraction light. The second signal waveform is related to spatial distribution of light intensity about second interference light by interference of the $m^{th}$ diffraction light and the $+n^{th}$ diffraction light. The third signal waveform is related to spatial distribution of light intensity about third interference light by interference of the $m^{th}$ diffraction light and the $-n^{th}$ diffraction light. The controller calculates a measurement error component based on a phase difference between the second signal waveform and the third signal waveform. The controller corrects the first signal waveform with using the calculated measurement error component.

15 Claims, 8 Drawing Sheets

(58) Field of Classification Search
CPC .... G03F 9/7034; G03F 9/7049; G03F 9/7073; G03F 9/7076; G01B 11/272; G01B 9/02027; G01B 9/0207
USPC ........................................................ 356/509
See application file for complete search history.

(56) References Cited

U.S. PATENT DOCUMENTS

| | | | |
|---|---|---|---|
| 2011/0141451 A1* | 6/2011 | Yamaguchi | G01D 5/38 355/77 |
| 2012/0057171 A1 | 3/2012 | Khuat Duy | |

FOREIGN PATENT DOCUMENTS

| | | |
|---|---|---|
| JP | 6-307811 | 11/1997 |
| JP | 2012-60120 | 3/2012 |

* cited by examiner

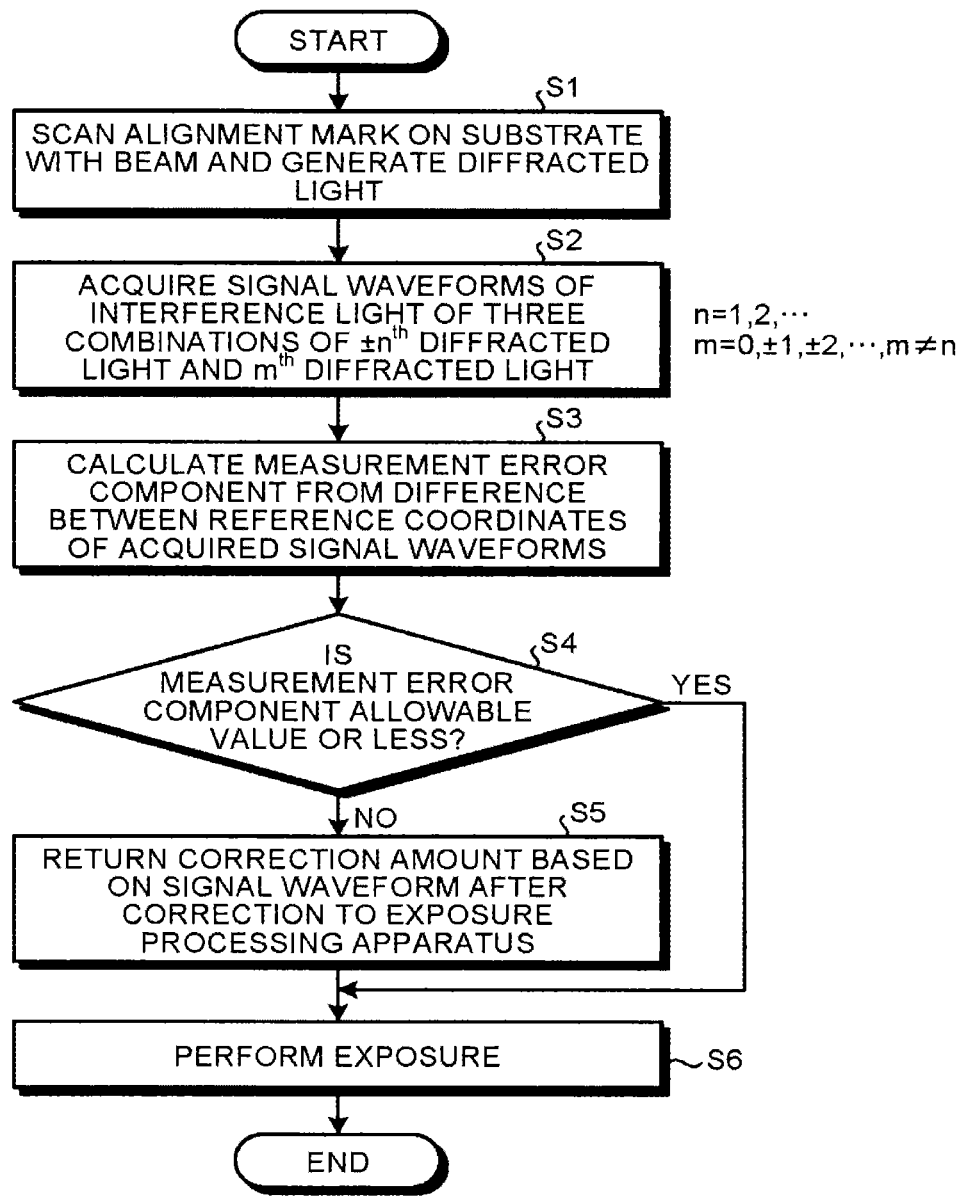

MEASUREMENT APPARATUS, EXPOSURE APPARATUS, MEASUREMENT METHOD, AND RECORDING MEDIUM

CROSS-REFERENCE TO RELATED APPLICATIONS

This application is based upon and claims the benefit of priority from U.S. Provisional Application No. 62/216,071, filed on Sep. 9, 2015; the entire contents of which are incorporated herein by reference.

FIELD

Embodiments described herein relate generally to a measurement apparatus, an exposure apparatus, a measurement method, and a recording medium.

BACKGROUND

In an exposure apparatus, to perform alignment between the exposure apparatus and a substrate, interference light according to diffraction light diffracted with an alignment mark on the substrate is detected, and alignment measurement is performed, by a measurement apparatus. At this time, improvement of accuracy of the alignment measurement is desired.

BRIEF DESCRIPTION OF THE DRAWINGS

FIG. 8 is a flowchart illustrating an operation of a measurement apparatus in an embodiment.

DETAILED DESCRIPTION

In general, according to one embodiment, there is provided a measurement apparatus including a controller. The controller acquires a first signal waveform, a second signal waveform, and a third signal waveform, n and m being mutually different integers. Among $m^{th}$ diffraction light and $\pm n^{th}$ diffraction light diffracted with an alignment mark on a substrate, the first signal waveform is related to spatial distribution of light intensity about first interference light by interference of the $\pm n^{th}$ diffraction light. The second signal waveform is related to spatial distribution of light intensity about second interference light by interference of the $m^{th}$ diffraction light and the $+n^{th}$ diffraction light. The third signal waveform is related to spatial distribution of light intensity about third interference light by interference of the $m^{th}$ diffraction light and the $-n^{th}$ diffraction light. The controller calculates a measurement error component based on a phase difference between the second signal waveform and the third signal waveform. The controller corrects the first signal waveform with using the calculated measurement error component.

Exemplary embodiments of an exposure apparatus will be explained below in detail with reference to the accompanying drawings. The present invention is not limited to the following embodiments.

Embodiment

Figure 1:
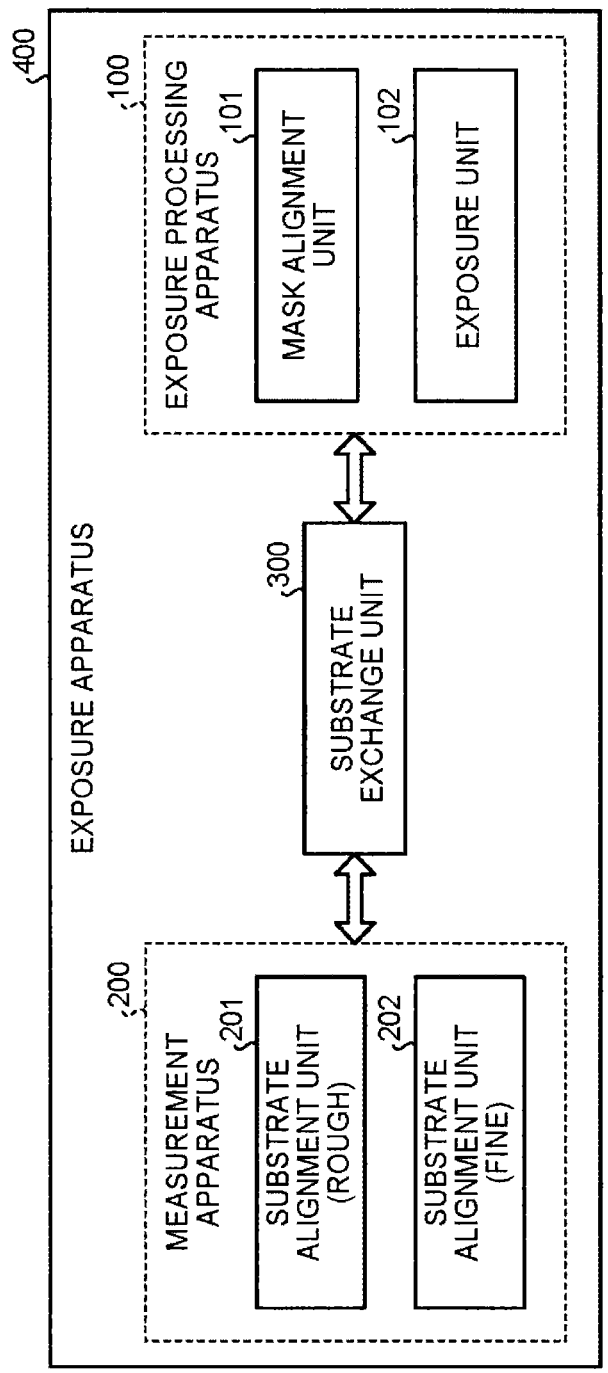
FIG. 1 is a diagram illustrating a configuration of an exposure apparatus according to an embodiment.

An exposure apparatus 400 according to an embodiment will be described using FIG. 1. FIG. 1 is a diagram illustrating a configuration of the exposure apparatus 400.

The exposure apparatus 400 transfers a desired pattern formed on a mask onto a substrate. At this time, to transfer the desired pattern onto an appropriate position on the substrate, substrate alignment control of positioning the substrate with respect to a substrate stage, and mask alignment control of positioning the mask with respect to a substrate stage are performed. With the control, positioning of the substrate and the mask is performed.

For example, as illustrated in FIG. 1, the exposure apparatus 400 includes a measurement apparatus 200, substrate exchange unit 300, and an exposure processing apparatus 100. The substrate exchange unit 300 conveys the substrate, which has been conveyed to the exposure apparatus 400, to a substrate stage in the measurement apparatus 200. The measurement apparatus 200 performs the substrate alignment control in a state where the substrate is held on the substrate stage. The measurement apparatus 200 includes substrate alignment units 201 and 202. The substrate alignment unit 201 irradiates an alignment mark formed on the substrate with light to acquire diffraction light, and causes the diffraction light to perform interference. The substrate alignment unit 201 roughly performs the substrate alignment measurement, using interference light of the interference. The substrate alignment unit 201 drives the substrate stage according to a measurement result, and performs the substrate alignment control of roughly positioning the substrate to the exposure apparatus 400. The substrate alignment unit 202 irradiates the alignment mark formed on the substrate with light to acquire diffraction light, and cause the diffraction light to perform interference, in a state where the substrate alignment control has been roughly performed by the substrate alignment unit 201. The substrate alignment unit 202 highly accurately (finely) performs the substrate alignment measurement, using interference light of the interference, drives the substrate stage according to a measurement result, and performs the substrate alignment control of highly accurately positioning the substrate to the exposure apparatus 400.

When the substrate alignment control by the measurement apparatus 200 has been completed, the substrate exchange unit 300 conveys the substrate from the substrate stage. The substrate exchange unit 300 conveys the conveyed substrate to a substrate stage in the exposure processing apparatus 100. The exposure processing apparatus 100 performs the mask alignment control in a state where the substrate is held on the substrate stage, and performs exposure processing. The exposure processing apparatus 100 includes a mask alignment unit 101 and an exposure unit 102. The mask alignment unit 101 irradiates the alignment mark formed on the mask with light to acquire diffraction light. The mask alignment unit 101 detects intensity of an optical image of formed diffraction light with an optical sensor provided on the substrate stage or the like, and performs the mask alignment measurement. The mask alignment unit 101 drives the substrate stage according to a measurement result, and performs the mask alignment control of positioning the mask to the substrate. Further, the exposure processing apparatus 100 performs focus control of bringing the height of the substrate close to a best focus position. The exposure unit 102 exposes the substrate in a state where the substrate alignment control, the mask alignment control, and the focus control have been performed. That is, the exposure unit 102 transfers the pattern on the mask onto the substrate, and forms a latent image of the substrate.

Figure 2:
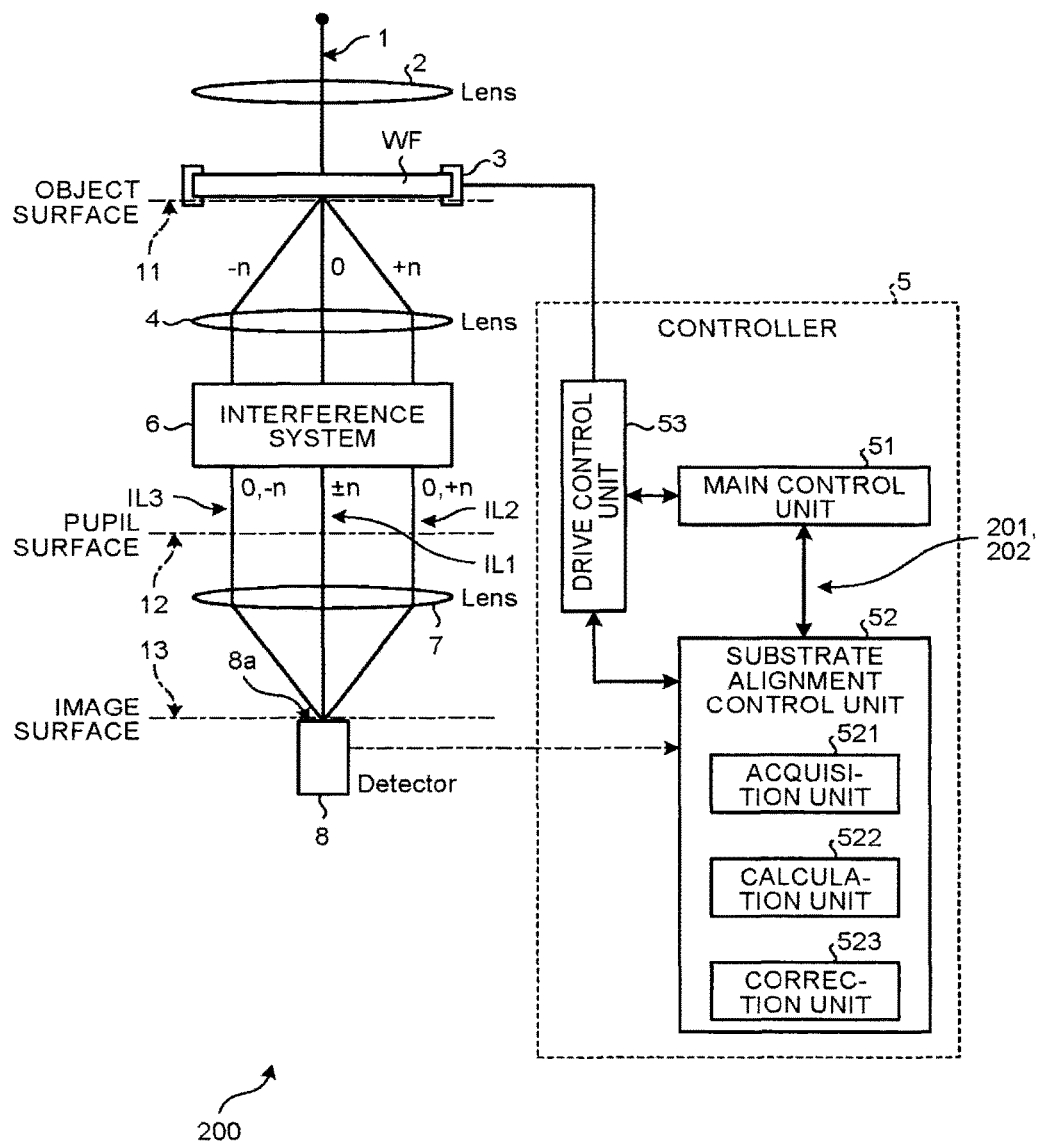
FIG. 2 is a diagram illustrating a configuration of a measurement apparatus in an embodiment.

In the substrate alignment control, the alignment measurement is performed by the measurement apparatus 200 illustrated in FIG. 2, for example. FIG. 2 is a diagram illustrating a configuration of the measurement apparatus 200. Note that the light that the substrate WF is irradiated with is reflected on the substrate WF. However, FIG. 2 illustrates a configuration in which light that the substrate WF is irradiated with transmits the substrate WF, as an optically equivalent configuration, for simplification of illustration.

The measurement apparatus 200 includes a light source 1, an optical system 2, a substrate stage 3, an optical system 4, an interference system 6, an optical system 7, a detector 8, and a controller 5. The substrate WF is held by the substrate stage 3. The alignment mark is formed on a surface (object surface 11) of the substrate WF. The alignment mark on the substrate WF includes a plurality of patterns repeated at a predetermined arrangement pitch P. Light emitted from the light source 1 (for example, laser light) is configured such that the substrate WF is irradiated with parallel light through the optical system 2, and the configuration is realized with a lens, for example. $\pm n^{th}$ diffraction light, of the diffraction light diffracted (reflected) at the alignment mark on the surface (object substrate 11) of the substrate WF, are led to the interference system 6 through the optical system 4 and are brought to interfere in the interference system 6. The optical system 4 is configured to collimate and lead the $\pm n^{th}$ diffraction light to the interference system 6, and is a lens, for example. Then, interference light IL1 by the interference of the $\pm n^{th}$ diffraction light is led to the detector 8 from the interference system 6 through the optical system 7. The optical system 7 is configured to focus the interference light IL1 from the interference system 6 on a detection surface 8a (image surface 13) of the detector 8, and is a lens, for example. The detector 8 detects light intensity of the interference light IL1. The detector 8 detects the light intensity of the interference light IL1 for each scan position of the light (for example, the laser light), and supplies the light intensity to the controller 5.

The controller 5 includes a main control unit 51, a substrate alignment control unit 52, and a drive control unit 53. The main control unit 51 totally controls respective units of the controller 5. The drive control unit 53 controls the position of the substrate WF through the substrate stage 3. In the substrate alignment control, the drive control unit 53 can control the scan position of the alignment mark on the substrate WF with the light from the light source 1. The substrate alignment control unit 52 receives information of the scan position from the drive control unit 53. The substrate alignment control unit 52 receives a detection result of the detector 8, and calculates an alignment deviation amount of the substrate WF, based on an alignment measurement result according to the scan position and the detection result of the detector 8.

For example, the substrate alignment control unit 52 plots the detection result of the detector 8 for each scan position of the light (for example, the laser light), and obtains a signal waveform WF1, as an alignment measurement result. The signal waveform WF1 is a waveform related to spatial distribution of the light intensity, and has a sine waveform shape with a cycle of 1/(2n) with respect to the arrangement pitch P of the pattern on the alignment mark. In the signal waveform WF1 in an ideal state, the light intensity becomes approximately zero in the scan position of an origin (see 73 of FIG. 7). The substrate alignment control unit 52 can identify the position of the alignment mark in one cycle, from the signal waveform WF1, and can identify an alignment deviation amount of the substrate WF. The substrate alignment control unit 52 calculates a correction amount (a drive amount of the substrate WF) by which the alignment deviation amount of the substrate WF is corrected, and supplies the correction amount to the drive control unit 53. The drive control unit 53 drives the substrate stage 3 to cancel the alignment deviation amount according to the correction amount. Accordingly, the substrate alignment control of positioning the substrate WF to the exposure apparatus 400 can be performed.

However, when the signal waveform WF1 that serves as a reference to calculate the alignment deviation amount includes a measurement error component, calculation accuracy of the alignment deviation amount may be deteriorated.

Figure 3:
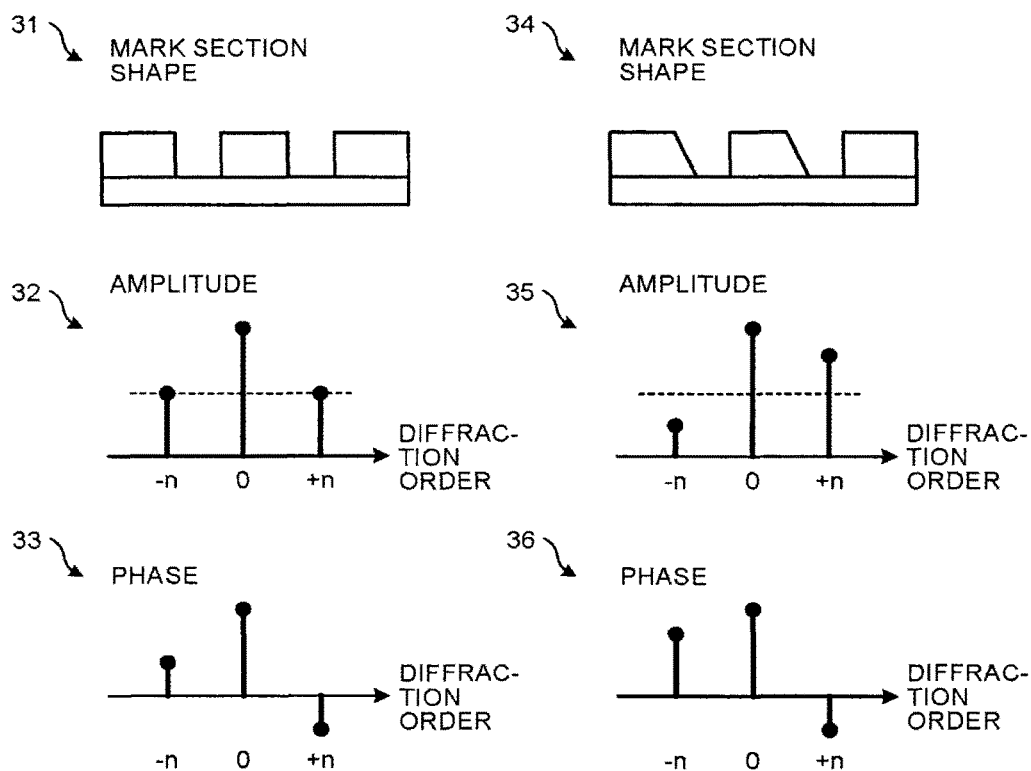
FIG. 3 is a diagram illustrating an example of a cause of occurrence of a measurement error in an embodiment.

For example, in an ideal state (for example, when a section shape of the alignment mark is approximately symmetrical to an optical axis, as illustrated by 31 of FIG. 3), amplitudes and phases of the $\pm n^{th}$ diffraction light are balanced. Absolute values of the amplitudes of the $\pm n^{th}$ diffraction light are approximately equal, as illustrated by 32 of FIG. 3, and a phase difference becomes an approximate 2n, as illustrated by 33 of FIG. 3.

Figure 5:
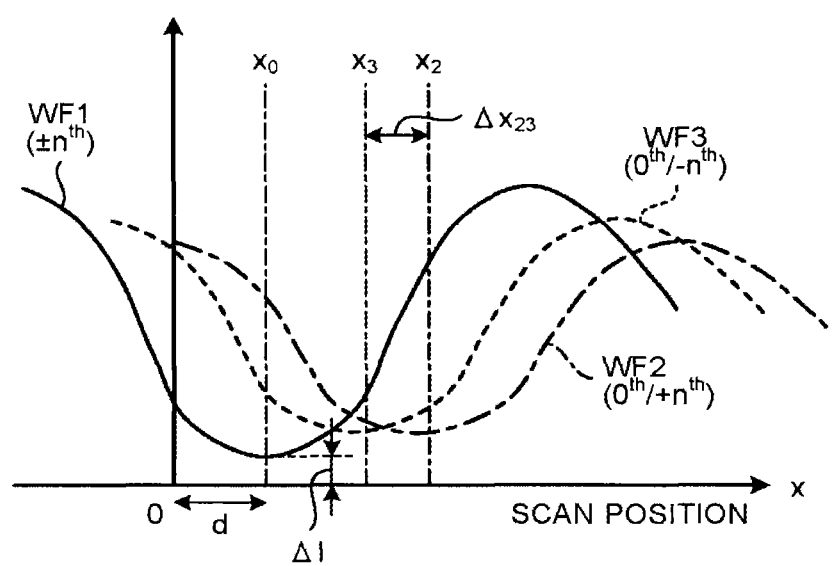
FIG. 5 is a diagram illustrating a measurement result of a measurement apparatus in an embodiment.

Meanwhile, in an unideal state, the relationship between the amplitudes and the phases of the $\pm n^{th}$ diffraction light loses the balance. For example, as illustrated by 34 of FIG. 3, when the section shape of the alignment mark is asymmetrical to the optical axis (for example, when the measurement apparatus 200 has an aberration, when the surface of the substrate WF is inclined with respect to a focus surface, or the like), the amplitudes of the $\pm n^{th}$ diffraction light have different absolute values, as illustrated by 35 of FIG. 3, and the phase difference deviates from 2n, as illustrated by 36 of FIG. 3. Accordingly, an offset component (an amplitude cause) ΔI and a shift component (a phase difference cause) d are included in the signal waveforms (the interference light intensity of the $\pm n^{th}$ diffraction light) WF1 acquired in the detector 8, as illustrated in FIG. 5, and measurement error components occur. Among the measurement error components, accuracy of the alignment measurement is mainly affected by the shift component d, and the shift component d can be considered dominant as the measurement error component in the alignment measurement. To avoid occurrence of deceit in position measurement in the alignment measurement, it is desired to accurately correct the shift component d.

Therefore, in the present embodiment, the measurement apparatus 200 acquires signal waveforms of interference light of $m^{th}$ ($m \ne \pm n$) diffraction light and the $\pm n^{th}$ diffraction light, obtains the measurement error component, based on the signal waveforms, and corrects the measurement result (the signal waveform of the interference light of the $\pm n^{th}$ diffraction light), thereby to enable highly accurate correction of the shift component d. Note that, hereinafter, the shift component d is dominant as the measurement error component, and will thus be described as a measurement error component d.

To be specific, the optical system 4 collimates and leads the ±n$^{th}$ diffraction light and the m$^{th}$ diffraction light to the interference system 6. The interference system 6 receives the m$^{th}$ diffraction light in addition to the ±n$^{th}$ diffraction light, and generates interference light IL1, IL2, and IL3, respectively. That is, the interference system 6 cause the +n$^{th}$ diffraction light and the −n$^{th}$ diffraction light to interfere to generate the interference light IL1. The interference system 6 causes the m$^{th}$ diffraction light and the +n$^{th}$ diffraction light to interfere to generate the interference light IL2. The interference system 6 causes the m$^{th}$ diffraction light and the −n$^{th}$ diffraction light to interfere to generate the interference light IL3.

'm' is an arbitrary integer different from ±n. Hereinafter, a case where m=0 will be exemplarily described. However, m may be an integer other than 0 as long as m is an integer different from ±n. When m=0, an incident position of 0$^{th}$ diffraction light collimated in the optical system 4 to the interference system 6 is more likely to be separated from incident positions of the ±n$^{th}$ diffraction light to the interference system 6. Therefore, the interference system 6 can easily distinguish the m$^{th}$ diffraction light from the ±n$^{th}$ diffraction light, and receives the m$^{th}$ diffraction light.

Figure 4:
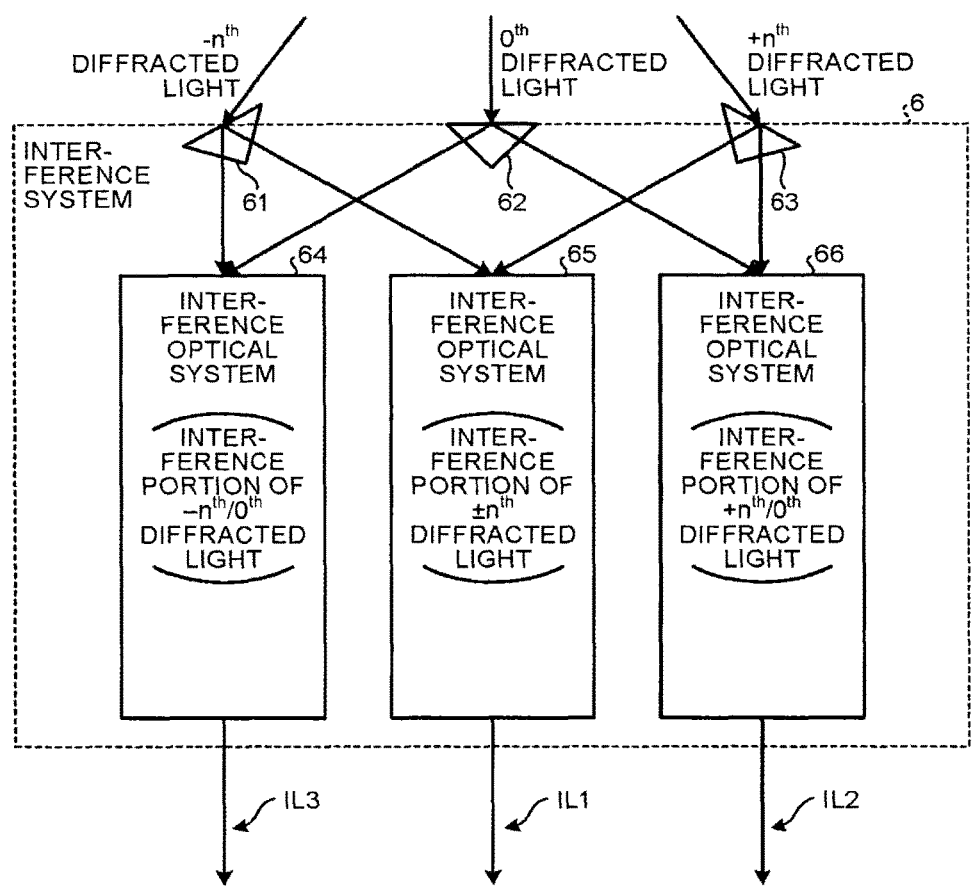
FIG. 4 is a diagram illustrating a configuration of an interference system in an embodiment.

For example, as illustrated in FIG. 4, the interference system 6 includes optical path adjusters 61 to 63 and interference optical systems 64 to 66. FIG. 4 is a diagram illustrating a configuration of the interference system 6. The optical path adjuster 61 receives the −n$^{th}$ diffraction light from the optical system 4, and leads the −n$^{th}$ diffraction light to the interference optical system 64 and the interference optical system 65. The optical path adjuster 62 receives the 0$^{th}$ diffraction light from the optical system 4, and leads the 0$^{th}$ diffraction light to the interference optical system 64 and the interference optical system 66. The optical path adjuster 63 receives the +n$^{th}$ diffraction light from the optical system 4 and leads the +n$^{th}$ diffraction light to the interference optical system 65 and the interference optical system 66. As the optical path adjusters 61 to 63, any optical elements can be used as long as the elements can be configured to separate the light and lead the light to two interference optical systems, and may be configured from a beam splitter, a lens, or the like, for example. The interference optical system 64 causes the −n$^{th}$ diffraction light and the 0$^{th}$ diffraction light to interfere to generate the interference light IL3. The interference optical system 65 cause the −n$^{th}$ diffraction light and the +n$^{th}$ diffraction light to interfere to generate the interference light IL1. The interference optical system 66 causes the 0$^{th}$ diffraction light and the +n$^{th}$ diffraction light to interfere to generate the interference light IL2.

The optical system 7 illustrated in FIG. 2 respectively focuses the interference light IL1, IL2, and IL3 from the interference system 6 on the detection surface 8a (image surface 13) of the detector 8. At this time, imaging positions of the interference light IL1, IL2, and IL3 on the detection surface 8a deviate. Therefore, the detector 8 can distinguish the interference light IL1, IL2, and IL3 from one another, and can detect the interference light IL1, IL2, and IL3. The detector 8 can be configured from an image sensor in which pixels are one-dimensionally or two-dimensionally arrayed. The detector 8 outputs intensity of the respective detected interference light IL1, IL2, and IL3 to the substrate alignment control unit 52 of the controller 5.

The substrate alignment control unit 52 receives the information of the scan positions by the light source 1 and the detection results of the detector 8. The substrate alignment control unit 52 respectively acquires the signal waveform WF1 by the interference light IL1, a signal waveform WF2 by the interference light IL2, and a signal waveform WF3 by the interference light IL3, based on the information of the scan positions and the detection results. The substrate alignment control unit 52 calculates the measurement error component d, based on the phase difference between the signal waveform WF2 and the signal waveform WF3. The substrate alignment control unit 52 corrects the signal waveform WF1, using the calculated measurement error component d.

For example, the substrate alignment control unit 52 includes an acquisition unit 521, a calculation unit 522, and a correction unit 523. The acquisition unit 521 receives the information of the scan positions by the light source 1 from the drive control unit 53, and receives the detection results of the detector 8, that is, the intensity of the interference light IL1, IL2, and IL3, from the detector 8. The acquisition unit 521 plots the intensity of the interference light IL1 for each scan position, and obtains the signal waveform WF1 illustrated in FIG. 5. FIG. 5 is a diagram illustrating the measurement results of the measurement apparatus 200. The signal waveform WF1 is the waveform related to the spatial distribution of the light intensity of the interference light IL1, and has the sine waveform shape with a cycle of 1/(2n) with respect to the arrangement pitch P of the pattern on the alignment mark.

Similarly, the acquisition unit 521 plots the intensity of the interference light IL2 for each scan position, and obtains the signal waveform WF2 illustrated in FIG. 5. The signal waveform WF2 is a waveform related to the spatial distribution of the light intensity of the interference light IL2, and has a sine waveform shape with a cycle of 1/n with respect to the arrangement pitch P of the pattern on the alignment mark. The acquisition unit 521 plots the intensity of the interference light IL3 for each scan position, and obtains the signal waveform WF3 illustrated in FIG. 5. The signal waveform WF3 is a waveform related to the spatial distribution of the light intensity of the interference light IL3, and has a sine waveform shape with a cycle of 1/n with respect to the arrangement pitch P of the pattern on the alignment mark.

The calculation unit 522 receives the information of the signal waveform WF2 and the signal waveform WF3 from the acquisition unit 521. The calculation unit 522 calculates the measurement error component d, based on the phase difference between the signal waveform WF2 and the signal waveform WF3. The substrate alignment control unit 52 obtains a coordinate difference between a reference coordinate of the signal waveform WF2 and a reference coordinate of the signal waveform WF3. The coordinate difference is an amount corresponding to the phase difference between the signal waveform WF2 and the signal waveform WF3. The substrate alignment control unit 52 obtains a reference value according to the arrangement pitch P of the pattern on the alignment mark. The reference value is P/(2n), for example, and the substrate alignment control unit 52 divides the arrangement pitch P by 2n to obtain the reference value. The substrate alignment control unit 52 subtracts the reference value from the coordinate difference and multiplies a subtraction result by ½ to obtain the measurement error component d.

The correction unit 523 receives the information of the measurement error component d from the calculation unit 522. The correction unit 523 shifts a phase of the signal waveform WF1 such that the measurement error component d is cancelled to correct the signal waveform WF1. Accordingly, the substrate alignment control unit 52 can obtain the corrected signal waveform WF1, as an appropriate alignment measurement result.

Figure 6:
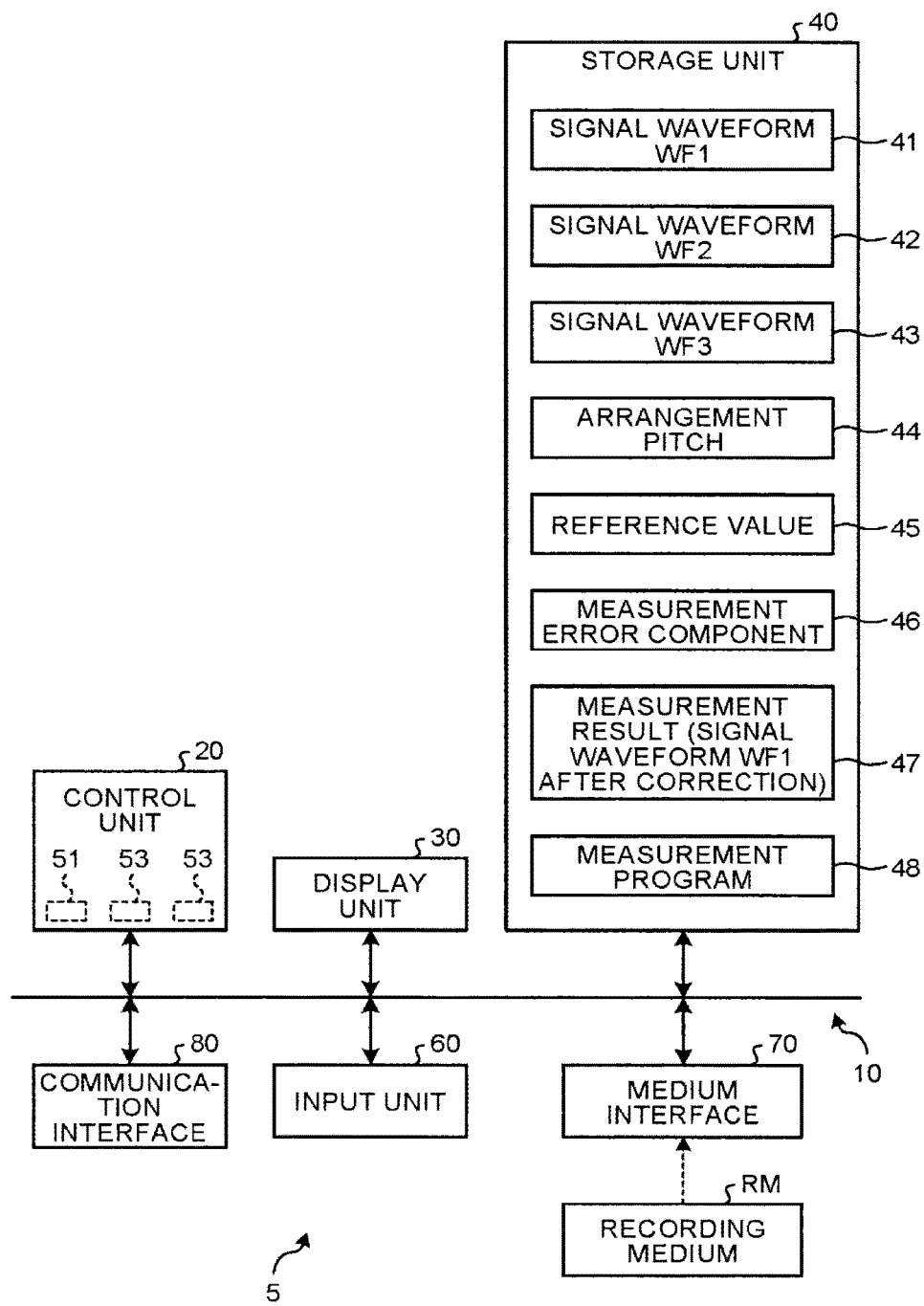
FIG. 6 is a diagram illustrating a hardware configuration of a controller in an embodiment.

Next, a hardware configuration of the controller 5 will be described using FIG. 6. FIG. 6 is a diagram illustrating a hardware configuration of the controller 5. The controller 5 includes a bus wire 10, a control unit 20, a display unit 30, a storage unit 40, an input unit 60, a medium interface 70, and a communication interface 80.

The control unit 20, the display unit 30, the storage unit 40, the input unit 60, the medium interface 70, and the communication interface 80 are mutually connected through the bus wire 10. The medium interface 70 is configured to be able to connect a recording medium RM. The communication interface 80 can receive information from an outside through a wired communication line or wireless communication line.

In the storage unit 40, data 41 of the signal waveform WF1, data 42 of the signal waveform WF2, data 43 of the signal waveform WF3, data 44 of the arrangement pitch, data 45 of the reference value, data 46 of the measurement error component, data 47 of the measurement results, and a measurement program 48 are stored.

The measurement program 48 functionally realizes the main control unit 51, the substrate alignment control unit 52, and the drive control unit 53, in the control unit 20, by being executed by the control unit 20, and functionally realizes the acquisition unit 521, the calculation unit 522, and the correction unit 523 of the substrate alignment control unit 52, in the control unit 20.

The data 41 of the signal waveform WF1, the data 42 of the signal waveform WF2, and the data 43 of the signal waveform WF3 are data of the signal waveforms obtained in the acquisition unit 521 and stored in the storage unit 40, respectively. The data 41 of the signal waveform WF1, the data 42 of the signal waveform WF2, and the data 43 of the signal waveform WF3 respectively include information in which the scan position and the intensity of the interference light IL1, IL2, and IL3 are associated with each other.

The data 44 of the arrangement pitch is data of the arrangement pitch P stored in the storage unit 40, as the arrangement pitch of the pattern on the alignment mark formed on the substrate WF. The data 45 of the reference value is data of the reference value obtained in the calculation unit 522 according to the arrangement pitch P.

The data 47 of the measurement result is data obtained such that the signal waveform WF1 is corrected in the correction unit 523, and is data of the signal waveform WF1 after correction, which is stored in the storage unit 40, as an appropriate alignment measurement.

The control unit 20 is a CPU, a GPU, a DSP, or a microcontroller, for example, and further includes a cache memory for temporal storage. The display unit 30 is a display device such as a CRT display or a liquid crystal display, for example. The storage unit 40 is a memory or a hard disk, for example. The input unit 60 is a keyboard or a mouse, for example. The medium interface 70 is a flexible disk drive, a CD-ROM drive, or a USB interface, for example. The recording medium RM is a flexible disk, a CD-ROM, a USB memory, or the like. The communication interface 80 is an interface configured in compliance with a standard of wired communication or wireless communication.

Figure 7:
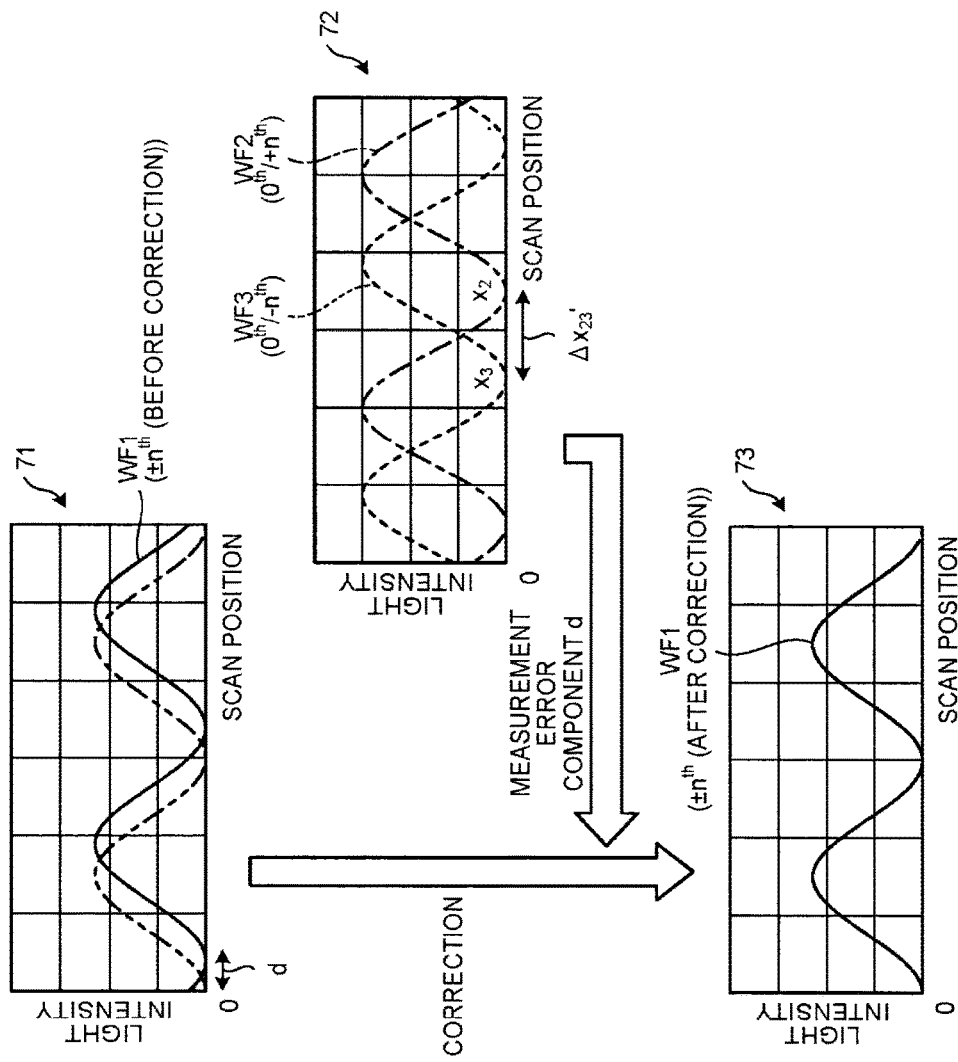
FIG. 7 is a diagram illustrating correction processing in an embodiment.

Next, correction processing in the measurement apparatus 200 will be described using FIGS. 5 and 7. FIG. 7 is a diagram illustrating a flow of the correction processing. FIG. 7 illustrates a case in which the offset component (amplitude cause) $\Delta I \cong 0$, for simplification of illustration and description.

For example, $$2\pi n/P = k \qquad \text{Formula 1}$$

is satisfied where the amplitude of the diffraction light is A, the phase is θ, and the arrangement pitch of the pattern on the alignment mark is P. Intensity $I_0$ of the signal waveform WF1 illustrated in FIG. 5 can be expressed by a following formula 2:

$$I_0 = A_{+n}^2 + A_{-n}^2 + 2A_{+n}A_{-n} \cos\{(\theta_{+n}-\theta_{-n})-2kx\} \qquad \text{Formula 2}$$

where (a shift amount at the time of mark scan)=x.

Maximum light intensity $I_{max}$ and minimum light intensity $I_{min}$ in the signal waveform WF1 are expressed by formulas 3 and 4 from the formula 2:

$$I_{max} = A_{+n}^2 + A_{-n}^2 + 2A_{+n}A_{-n} = (A_{+n}+A_{-n})^2 \qquad \text{Formula 3}$$

$$I_{min} = A_{+n}^2 + A_{-n}^2 - 2A_{+n}A_{-n} = (A_{+n}-A_{-n})^2 \qquad \text{Formula 4}$$

When the formulas 3 and 4 are arranged, the amplitudes of the $\pm n^{th}$ diffraction light can be expressed by a following formula 5:

$$A_{\pm} = \frac{1}{2} \times \{\sqrt{(I_{max})} - \sqrt{(I_{min})}\} \qquad \text{Formula 5}$$

Minimization of the light intensity is based on conditions of following formulas 6 and 7:

$$\cos\{(\theta_{+n}-\theta_{-n})-2kx\} = -1 \qquad \text{Formula 6}$$

$$x = d \qquad \text{Formula 7}$$

The measurement error component d can be obtained from the formulas 6 and 7, like a next formula 8:

$$d = \{(\theta_{+n}-\theta_{-n})-\pi\}/(2k) \qquad \text{Formula 8}$$

As indicated by the formula 8, the measurement error component d can be calculated from the phase difference $(\theta_{+n}-\theta_{-n})$ of the $\pm n^{th}$ diffraction light. The phase difference is expressed by $\phi = (\theta_{+n}-\theta_{-n})$.

Here, it is difficult to directly measure the phase difference φ of the diffraction light. Therefore, a method of calculating the measurement error component d using interference is proposed. In an interference system for alignment measurement, the $\pm n^{th}$ diffraction light is brought to interfere, and the $0^{th}$ diffraction light is not often used. In the proposed technique, interference of the $0^{th}$ diffraction light and the $\pm n^{th}$ diffraction light is added. The light intensity of the interference light IL3 of the $0^{th}$ diffraction light and the $-n^{th}$ diffraction light, and the light intensity of the interference light IL2 of the $0^{th}$ diffraction light and the $+n^{th}$ diffraction light are detected in the detector 8.

For example, as illustrated in FIG. 5, the reference coordinate (the phase=the coordinate of the position of $-\pi$) of the signal waveform WF1 of the interference light IL1 of the $\pm n^{th}$ diffraction light is $x_0$, the reference coordinate of the signal waveform WF2 of the interference light IL2 of the $0^{th}$ diffraction light and the $+n^{th}$ diffraction light is $x_2$, and the reference coordinate of the signal waveform WF3 of the interference light IL3 of the $0^{th}$ diffraction light and the $-n^{th}$ diffraction light is $x_3$. At this time, the intensity $I_0$ of the signal waveform WF1 is expressed by the formula 2, and intensity $I_2$ and intensity of $I_3$ of the signal waveforms WF2 and WF3 are respectively expressed by next formulas 9 and 10:

$$I_3 = A_{+n}^2 + A_0^2 + 2A_{+n}A_0 \cos\{(\theta_{+n}-\theta_0)-kx\} \qquad \text{Formula 9}$$

$$I_3 = A_{-n}^2 - A_0^2 + 2A_{-n}A_0 \cos\{(\theta_{-n}-\theta_0)-kx\} \qquad \text{Formula 10}$$

At this time, the coordinate difference between the reference coordinate of the signal waveform WF2 and the reference coordinate of the signal waveform WF3 is an amount corresponding to the phase difference between the signal waveform WF2 and the signal waveform WF3, and thus can be used as a parameter for calculating the measurement error component d.

If the measurement error component d≅0, $x_0$=0, and $\phi=(\theta_{+n}-\theta_{-n})=\pi$ are satisfied. Therefore, a next formula 11 is established about a parameter $\Delta x_{23}$ according to the formulas 1, 9, and 10:

$$\Delta x_{23}=x_2-x_3=(\theta_{+n}-\theta_{-n})/k=P/(2n) \qquad \text{Formula 11}$$

That is, P/(2n) serves as the reference value of the parameter.

Further, when the measurement error component d≠0, and an error of the phase difference is $\phi_0$, $x_0$=0+d, and $\phi=(\theta_{+n}-\theta_{-n})=\pi+\phi_0$ are satisfied, and a following formula 12 is established:

$$\alpha=x_2-x_3-P/(2n) \qquad \text{Formula 12}$$

where a difference between a parameter $\Delta x_{23}'=x_2-x_3$ and the parameter $\Delta x_{23}$ of the formula 11 is $\alpha$.

A next formula 13 is established according to the formulas 8, 11, and 12:

$$d=\{x_2-x_3-P/(2n)\}/2=2\alpha \qquad \text{Formula 13}$$

That is, it can be seen that the measurement error component d can be obtained by measuring the coordinate difference between the reference coordinates of the signal waveforms WF2 and WF3, as a parameter, subtracting the reference value (for example, P/(2n) indicated by the formula 11) from the value $\Delta x_{23}'$ of the measured parameter, and amplifying the subtraction result by ½.

For example, assume that the controller 5 has obtained the signal waveform WF1 illustrated by the solid line waveform 71 in FIG. 7. The signal waveform WF1 illustrated by the solid line waveform 71 deviates from an ideal waveform illustrated by the two-dot chain line by the shift component d, and is a signal waveform including the measurement error component d. In FIG. 7, the reference position of the ideal waveform is an original position of coordinates, for simplification of illustration. However, in actual alignment measurement, the reference position of the ideal waveform may deviate from the original position of coordinates. Therefore, the measurement error component d is an unknown value.

The controller 5 acquires the signal waveform WF2 illustrated by the one-dot chain line in FIG. 7 and the signal waveform WF3 illustrated by the broken line. The controller 5 respectively obtain the reference coordinates (the phase=the coordinate of the position of −π) $x_2$ and $x_3$ of the signal waveforms WF2 and WF3. The controller 5 obtains a difference $(x_2-x_3)$ between the reference coordinates of the signal waveforms WF2 and WF3, as an evaluation parameter $\Delta x_{23}'$. Then, the controller 5 obtains the measurement error component d according to the formula 16. The sign of the obtained measurement error component d indicates a direction of deviation.

The controller 5 shifts the phase of the signal waveform WF1 illustrated by the solid line waveform 71 in FIG. 7 such that the measurement error component d is cancelled. Accordingly, the controller 5 can obtain the signal waveform WF1 after correction illustrated by the solid line waveform 73 in FIG. 7, as an appropriate alignment measurement result.

Next, an operation of the measurement apparatus 200 will be described using FIG. 8. FIG. 8 is a flowchart illustrating an operation of the measurement apparatus 200.

The measurement apparatus 200 scans the alignment mark on the substrate WF with the light (for example, a laser beam) from the light source 1, and generates the diffraction light with the alignment mark (S1). A plurality of types of diffraction light including the $m^{th}$ diffraction light and the $\pm n^{th}$ diffraction light are generated with the alignment mark. m is an arbitrary integer different from ±n.

The interference system 6 causes the $+n^{th}$ diffraction light and the $-n^{th}$ diffraction light to interfere to generate the interference light IL1. The interference system 6 causes the $m^{th}$ diffraction light and the $+n^{th}$ diffraction light to interfere to generate the interference light IL2. The interference system 6 causes the $m^{th}$ diffraction light and the $-n^{th}$ diffraction light to interfere to generate the interference light IL3. The detector 8 distinguishes the intensity of the interference light IL1, IL2, and IL3 from one another, detects the intensity, and outputs detection results to the controller 5. The controller 5 respectively acquire the signal waveform WF1 by the interference light IL1, the signal waveform WF2 by the interference light IL2, and the signal waveform WF3 by the interference light IL3, based on the information of the scan positions and the detection results (S2).

The controller 5 obtains the difference (coordinate difference) between the reference coordinate of the signal waveform WF2 and the reference coordinate of the signal waveform WF3. The controller 5 obtains the reference value according to the arrangement pitch P of the pattern on the alignment mark. The controller 5 subtracts the reference value from the coordinate difference and multiplies the subtraction result by ½ to obtain the measurement error component d (S3).

The controller 5 determines whether the measurement error component d obtained in S3 is an allowable value or less (S4). When the measurement error component d is larger than the allowable value (No in S4), the controller 5 corrects the alignment measurement result (the signal waveform WF1 of the interference light IL1 of the $\pm n^{th}$ diffraction light) with the measurement error component d, obtains the alignment deviation amount (correction amount), based on the corrected signal waveform WF1, and supplies the alignment deviation amount to the exposure processing apparatus 100 (S5). When the measurement error component d is the allowable value or less (Yes in S4), the controller 5 obtains the alignment deviation amount (correction amount), based on the signal waveform WF1, without correcting the alignment measurement result (the signal waveform WF1 of the interference light IL1 of the $\pm n^{th}$ diffraction light), and supplies the alignment deviation amount to the exposure processing apparatus 100. Then, the exposure processing apparatus 100 performs the mask alignment control, using the alignment deviation amount, and performs the exposure processing of exposing the substrate WF in a state where the substrate alignment control, the mask alignment control, and the focus control have been performed (S6).

As described above, in the embodiment, the controller 5 acquires the signal waveforms of the interference light of the $m^{th}$ (m≠±n) diffraction light and the $\pm n^{th}$ diffraction light, and obtains the measurement error component, based on the signal waveforms, in the measurement apparatus 200. For example, the controller 5 obtains the coordinate difference between the reference coordinate of the signal waveform WF2 of the interference light IL2 of the $m^{th}$ diffraction light and the $+n^{th}$ diffraction light, and the reference coordinate of the signal waveform WF3 of the interference light IL3 of the $m^{th}$ diffraction light and the $-n^{th}$ diffraction light. The controller 5 subtracts the reference value from the coordinate difference and multiplies the subtraction result by ½ to obtain the measurement error component. The controller 5 corrects the alignment measurement result (the signal waveform WF1 of the interference light IL1 of the ±n$^{th}$ diffraction light), using the measurement error component. Accordingly, the shift component d included in the alignment measurement result can be highly accurately corrected, and accuracy of the alignment measurement can be improved.

Note that, in the embodiment, a case where the reference coordinates of the signal waveforms WF2 and WF3 are the coordinates of the positions of the phase=−π has been exemplarily described. However, coordinates of another phase may be used as the reference coordinates as long as the coordinates are coordinates of corresponding positions between the signal waveforms WF2 and WF3.

Further, in the embodiment, a case in which the detector 8 is arranged to detect the interference light IL1 to IL3 on the image surface 13 in the measurement apparatus 200 has been exemplarily described. However, the detector 8 may be arranged to detect the interference light IL1 to IL3 on the pupil surface 12. In this case, the imaging positions of the interference light IL1, IL2, and IL3 on the detection surface 8a further deviate. Therefore, the detector 8 can easily distinguish the intensity of the interference light IL1, IL2, and IL3 from one another, and can easily detect the intensity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A measurement apparatus comprising:
    a controller that acquires a first signal waveform, a second signal waveform, and a third signal waveform, n and m being mutually different integers, among m$^{th}$ diffraction light and ±n$^{th}$ diffraction light diffracted with an alignment mark on a substrate, the first signal waveform being related to spatial distribution of light intensity about first interference light by interference of the ±n$^{th}$ diffraction light, the second signal waveform being related to spatial distribution of light intensity about second interference light by interference of the m$^{th}$ diffraction light and the +n$^{th}$ diffraction light, the third signal waveform being related to spatial distribution of light intensity about third interference light by interference of the m$^{th}$ diffraction light and the −n$^{th}$ diffraction light, and that calculates a measurement error component based on a phase difference between the second signal waveform and the third signal waveform, and that corrects the first signal waveform with using the calculated measurement error component,
    the measuring apparatus further comprising:
        an interference system that receives the diffracted ±n$^{th}$ diffraction light and the diffracted m$^{th}$ diffraction light, and generates the first interference light, the second interference light, and the third interference light; and
        a detector that detects the generated first interference light, the generated second interference light, and the generated third interference light, wherein the controller generates the first signal waveform, the second signal waveform, and the third signal waveform, according to detection results of the first interference light, the second interference light, and the third interference light, and the interference system includes
            a first optical system that causes the diffracted ±n$^{th}$ diffraction light to interfere to generate the first interference light,
            a second optical system that causes the diffracted m$^{th}$ diffraction light and the diffracted ±n$^{th}$ diffraction light lo interfere lo generate the second interference light, and
            a third optical system that causes the diffracted m$^{th}$ diffraction light and the +n$^{th}$ diffraction light to interfere to generate the third interference light.

2. The measurement apparatus according to claim 1, wherein
    the controller obtains a coordinate difference between a reference coordinate of the second signal waveform and a reference coordinate of the third signal waveform, and subtracts a reference value according to an arrangement pitch of a pattern at the alignment mark from the coordinate difference and multiplies a subtraction result by ½ to obtain the measurement error component.

3. The measurement apparatus according to claim 1, wherein
    the controller shifts a phase of the first signal waveform to correct the first signal waveform such that the calculated measurement error component is cancelled.

4. The measurement apparatus according to claim 1, wherein
    m=0.

5. The measurement apparatus according to claim 1, the measurement apparatus wherein the first signal waveform, the second signal waveform, and the third signal waveform indicate relationships between detection positions of the detector and the signal intensity.

6. The measurement apparatus according to claim 5, wherein
    the controller shifts a phase of the first signal waveform to correct the first signal waveform such that the calculated measurement error component is cancelled.

7. The measurement apparatus according to claim 1, wherein
    the measurement error component is a component occurring due to at least one of asymmetry of a section shape of the alignment mark, an aberration that the measurement apparatus has, and an inclination of the substrate.

8. A measurement apparatus comprising:
    an interference system including a first optical system, a second optical system, and a third optical system, n and m being mutually different integers, among m$^{th}$ diffraction light and ±n$^{th}$ diffraction light diffracted with an alignment mark on a substrate, the first optical system causing diffracted ±n$^{th}$ diffraction light to interfere to generate first interference light, the second optical system causing diffracted m$^{th}$ diffraction light and the diffracted +n$^{th}$ diffraction light to interfere to generate second interference light, the third optical system causing the diffracted m$^{th}$ diffraction light and the diffracted −n$^{th}$ diffraction light to interfere to generate third interference light; and
    a detector that mutually distinguishes and detects the first interference light, the second interference light, and the third interference and the third interference light,
    the measurement apparatus further comprising:
    a controller that generates a first signal waveform, a second signal waveform, and a third signal waveform according to detection results of the detector, the first signal waveform being related to spatial distribution of light intensity of the first interference light, the second signal waveform being related to spatial distribution of light intensity of the second interference light, the third signal waveform being related to spatial distribution of light intensity of the third interference light, and that calculates a measurement error component based on a phase difference between the second signal waveform and the third signal waveform, and that corrects the first signal waveform with using the calculated measurement error component.

9. An exposure apparatus comprising:
the measurement apparatus according to claim 1 that performs alignment measurement of a substrate with using an alignment mark on the substrate, and obtains a corrected first signal waveform; and
an exposure processing apparatus that performs exposure processing of the substrate in a state where alignment control of a position of the substrate has been performed according to the corrected first signal waveform.

10. An exposure apparatus comprising:
a measurement apparatus according to claim 8 that performs alignment measurement of a substrate with using an alignment mark on the substrate; and
an exposure processing apparatus that performs exposure processing of the substrate in a state where alignment control of a position of the substrate has been performed according to an alignment measurement result of the measurement apparatus.

11. A measurement method comprising:
acquiring a first signal waveform, a second signal waveform, and a third signal waveform, n and m being mutually different integers, among $m^{th}$ diffraction light and $\pm n^{th}$ diffraction light diffracted with an alignment mark on a substrate, the first signal waveform being related to spatial distribution of light intensity about first interference light by interference of the $\pm n^{th}$ diffraction light, the second signal waveform being related to spatial distribution of light intensity about second interference light by interference of the $m^{th}$ diffraction light and the $+n^{th}$ diffraction light, the third signal waveform being related to spatial distribution of light intensity about third interference light by interference of the $m^{th}$ diffraction light and the $-n^{th}$ diffraction light;
calculating a measurement error component based on a phase difference between the second signal waveform and the third signal waveform; and
correcting the first signal waveform with using the calculated measurement error component, wherein
the acquiring includes
generating the first interference light, the second interference light, and the third interference light by a first optical system, a second optical system, and a third optical system, respectively,
detecting the generated first interference light, the generated second interference light, and the generated third interference light, and
generating the first signal waveform, the second signal waveform, and the third signal waveform according to detection results.

12. The measurement method according to claim 11, wherein the calculating includes
obtaining a coordinate difference between a reference coordinate of the second signal waveform and a reference coordinate of the third signal waveform, and
subtracting a reference value according to an arrangement pitch of a pattern at the alignment mark from the coordinate difference and multiplying the subtraction result by ½ to obtain the measurement error component.

13. The measurement method according to claim 11, wherein the correcting includes
shifting a phase of the first signal waveform to correct the first signal waveform such that the calculated measurement error component is cancelled.

14. The measurement method according to claim 11, wherein
m=0.

15. A nontransitory computer readable recording medium recording a program for causing a computer to execute:
acquiring a first signal waveform, a second signal waveform, and a third signal waveform, n and m being mutually different integers, among $m^{th}$ diffraction light and $\pm n^{th}$ diffraction light diffracted with an alignment mark on a substrate, the first signal waveform being related to spatial distribution of light intensity about first interference light by interference of the $\pm n^{th}$ diffraction light, the second signal waveform being related to spatial distribution of light intensity about second interference light by interference of the $m^{th}$ diffraction light and the $+n^{th}$ diffraction light, the third signal waveform being related to spatial distribution of light intensity about third interference light by interference of the $m^{th}$ diffraction light and the $-n^{th}$ diffraction light;
calculating a measurement error component based on a phase difference between the second signal waveform and the third signal waveform; and
correcting the first signal waveform with using the calculated measurement error component, wherein
the acquiring includes
generating the first interference light, the second interference light, and the third interference light, by a first optical system, a second optical system, and a third optical system, respectively,
detecting the generated first interference light, the generated second interference light, and the generated third interference light, and
generating the first signal waveform, the second signal waveform, and the third signal waveform according to detection results.

* * * * *